United States Patent [19]

Harari

[11] Patent Number: 5,786,988
[45] Date of Patent: Jul. 28, 1998

[54] INTEGRATED CIRCUIT CHIPS MADE BENDABLE BY FORMING INDENTATIONS IN THEIR BACK SURFACES FLEXIBLE PACKAGES THEREOF AND METHODS OF MANUFACTURE

[75] Inventor: Eliyahou Harari, Los Gatos, Calif.

[73] Assignee: SanDisk Corporation, Sunnyvale, Calif.

[21] Appl. No.: 678,421

[22] Filed: Jul. 2, 1996

[51] Int. Cl.⁶ .................................................... H05K 1/18
[52] U.S. Cl. .................... 361/749; 361/749; 361/736; 361/783; 361/807; 361/737; 361/684; 257/618; 257/622; 257/730; 257/679; 257/620; 235/492; 235/487
[58] Field of Search ...................... 361/749, 736, 361/783, 807, 737, 684; 257/618, 622, 730, 679, 620; 235/492, 487

[56] References Cited

U.S. PATENT DOCUMENTS

| | | | |
|---|---|---|---|
| 3,702,464 | 11/1972 | Castrucci | 235/492 |
| 4,266,334 | 5/1981 | Edwards et al. | 438/64 |
| 4,417,413 | 11/1983 | Hoppe et al. | 40/630 |
| 4,803,542 | 2/1989 | Haghiri-Tehrani et al. | 257/679 |
| 4,804,828 | 2/1989 | Oogita | 235/10 |
| 4,889,980 | 12/1989 | Hara et al. | 235/488 |
| 4,943,708 | 7/1990 | Simmons et al. | 235/488 |
| 5,031,026 | 7/1991 | Ueda | 257/679 |
| 5,130,783 | 7/1992 | McLellan | 257/727 |
| 5,255,430 | 10/1993 | Tallaksen | 29/827 |
| 5,261,999 | 11/1993 | Pinker et al. | 156/630 |
| 5,264,990 | 11/1993 | Vernambre | 361/761 |
| 5,311,396 | 5/1994 | Steffen | 361/736 |
| 5,399,907 | 3/1995 | Nguyen et al. | 257/783 |
| 5,480,842 | 1/1996 | Clifton et al. | 437/226 |
| 5,581,445 | 12/1996 | Horejs, Jr. et al. | 361/737 |

Primary Examiner—Leo P. Picard
Assistant Examiner—David Foster
Attorney, Agent, or Firm—Majestic, Parsons, Siebert & Hsue

[57] ABSTRACT

The flexibility of normally brittle and breakable integrated circuit chips is increased by forming grooves, trenches, a series of holes, or the like, in a surface of the circuit chips that is opposite to the surface on which the integrated circuit is formed. Packages including one or more such circuit chips can then be bent to some degree without breaking the chips. This is quite useful for emerging flexible circuit chip packages, and for credit card sized packages that include one or more circuit chips, such as the smart card carried by individuals.

59 Claims, 5 Drawing Sheets

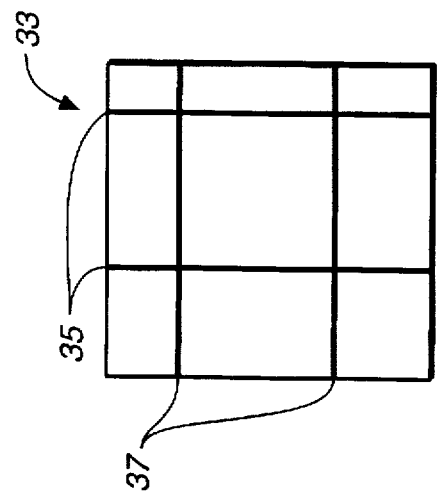
FIG._1C
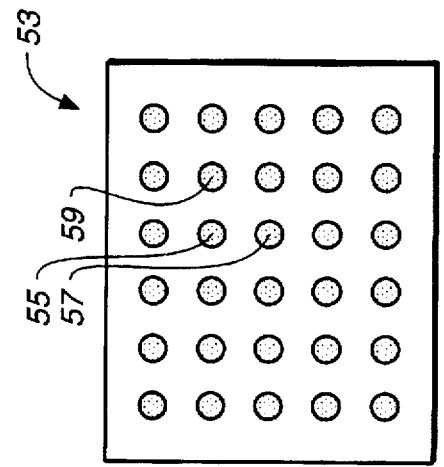
FIG._1F
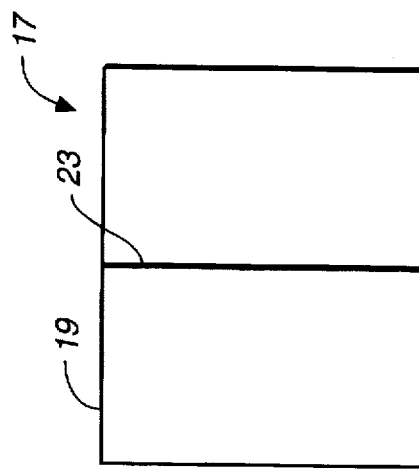
FIG._1B
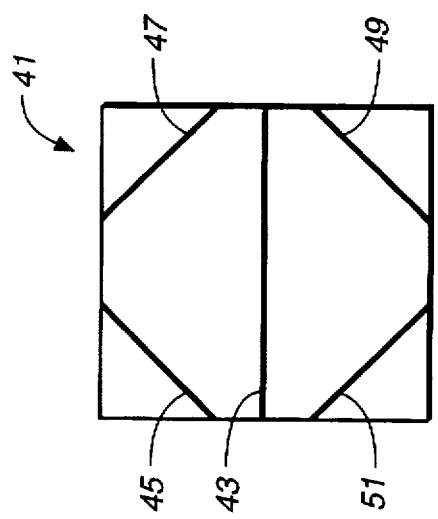
FIG._1E
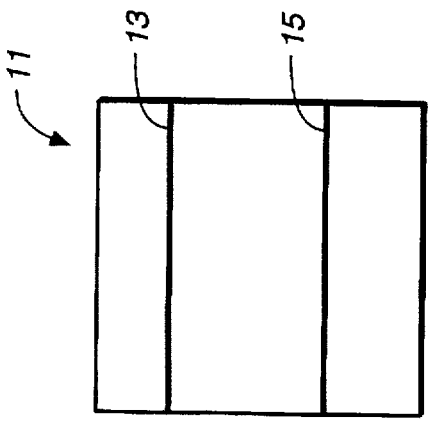
FIG._1A
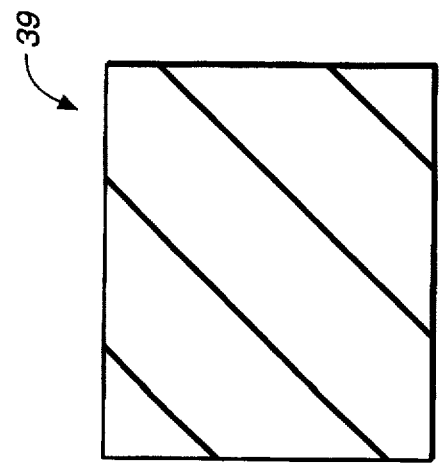
FIG._1D

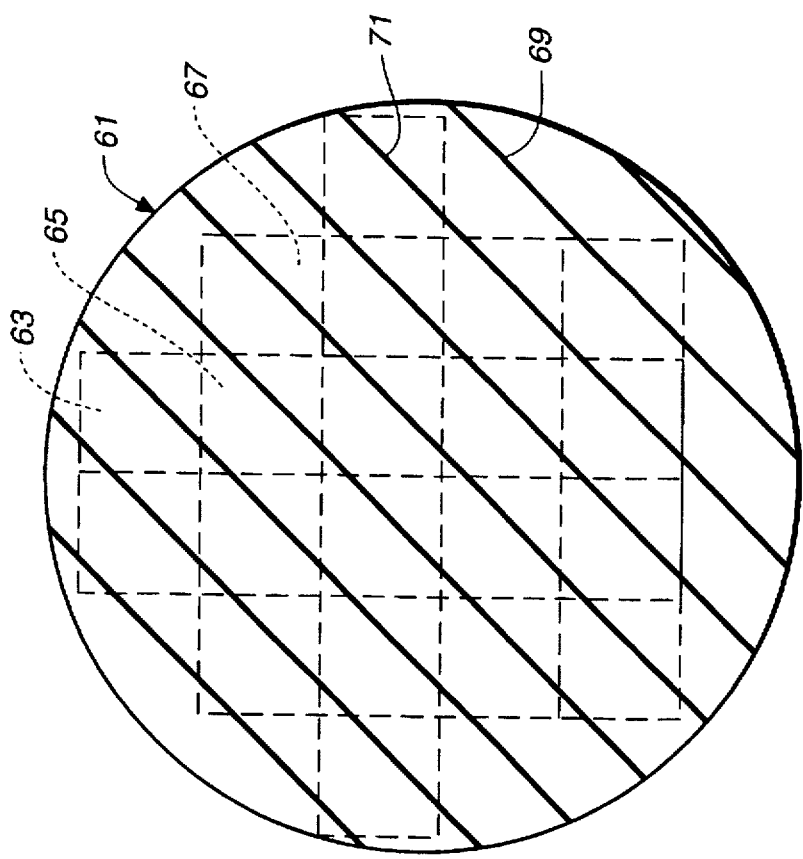
FIG._3
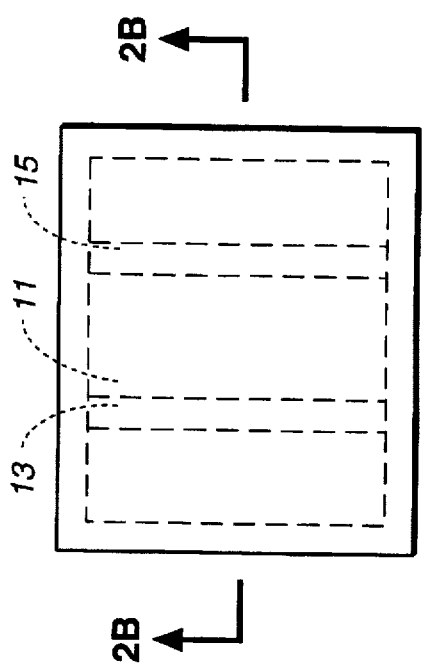
FIG._2A
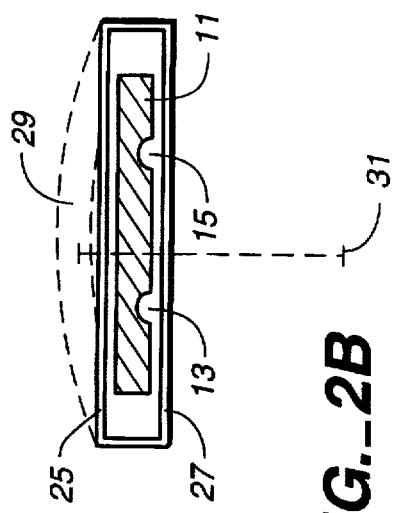
FIG._2B

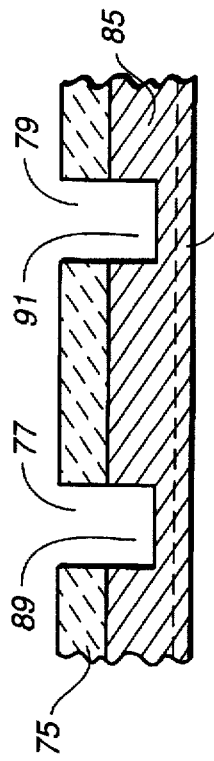
FIG._4
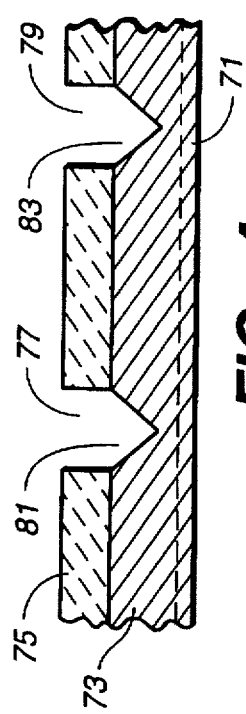
FIG._5
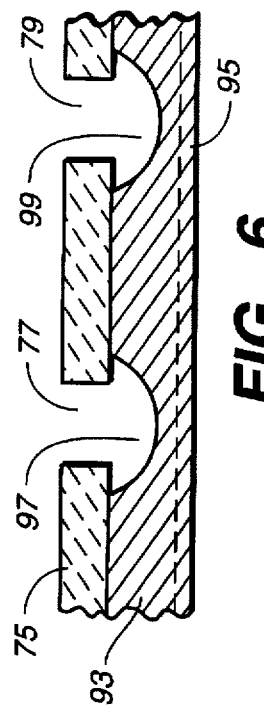
FIG._6
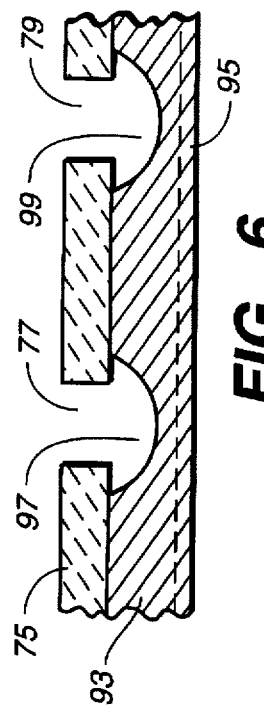
FIG._7
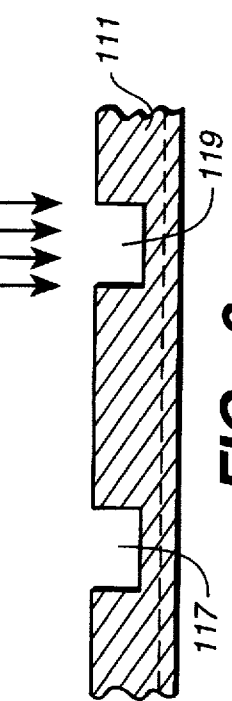
FIG._8
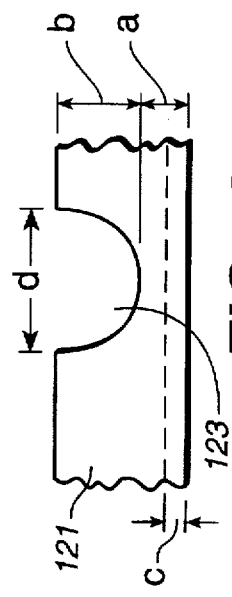
FIG._9

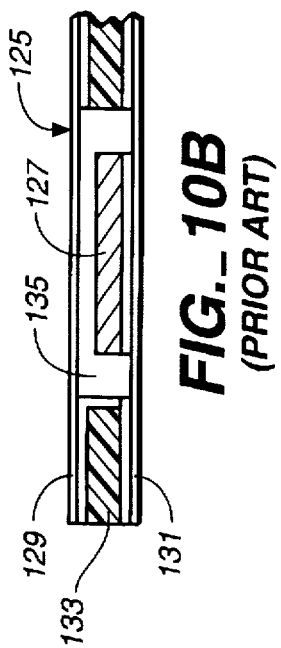
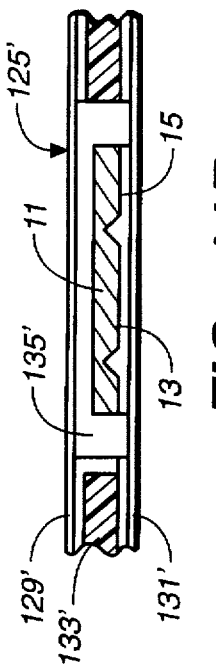
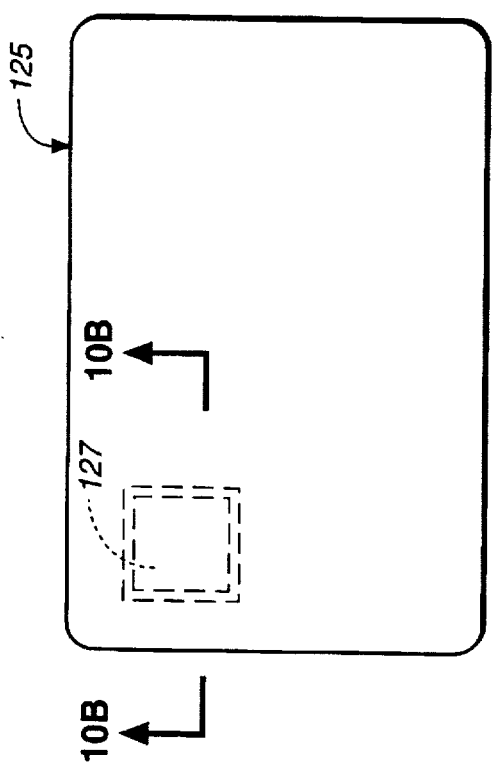
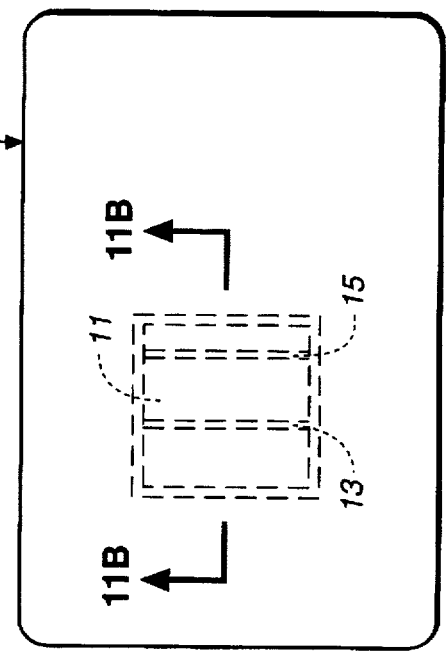

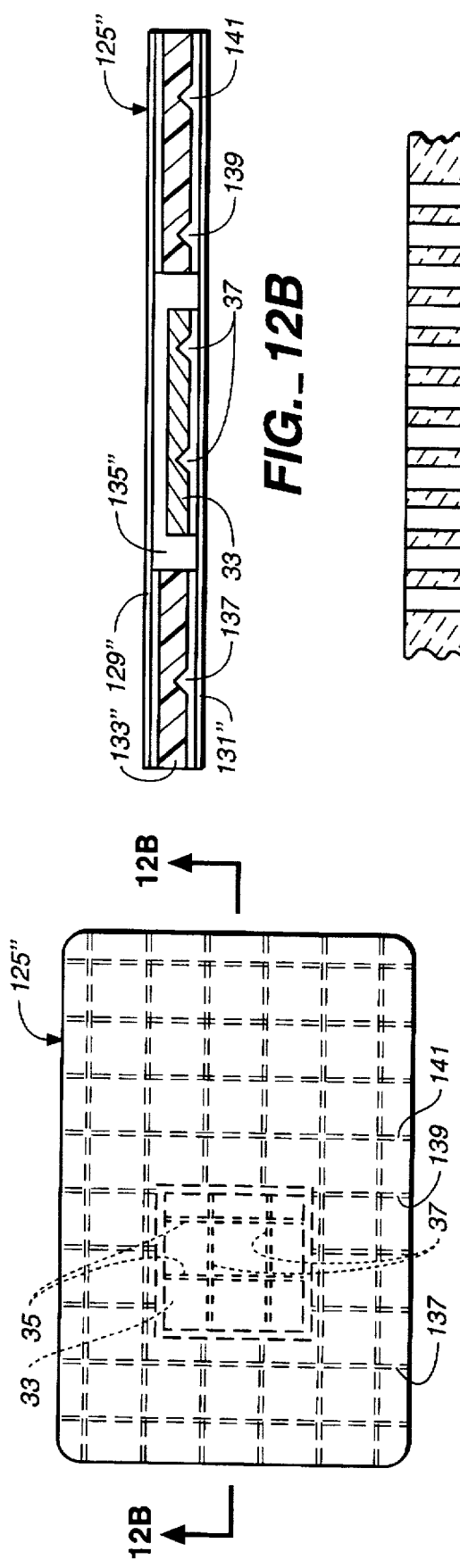
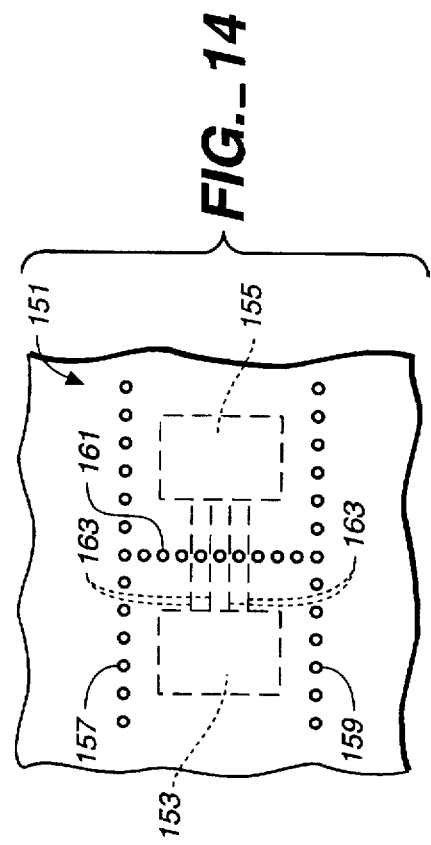
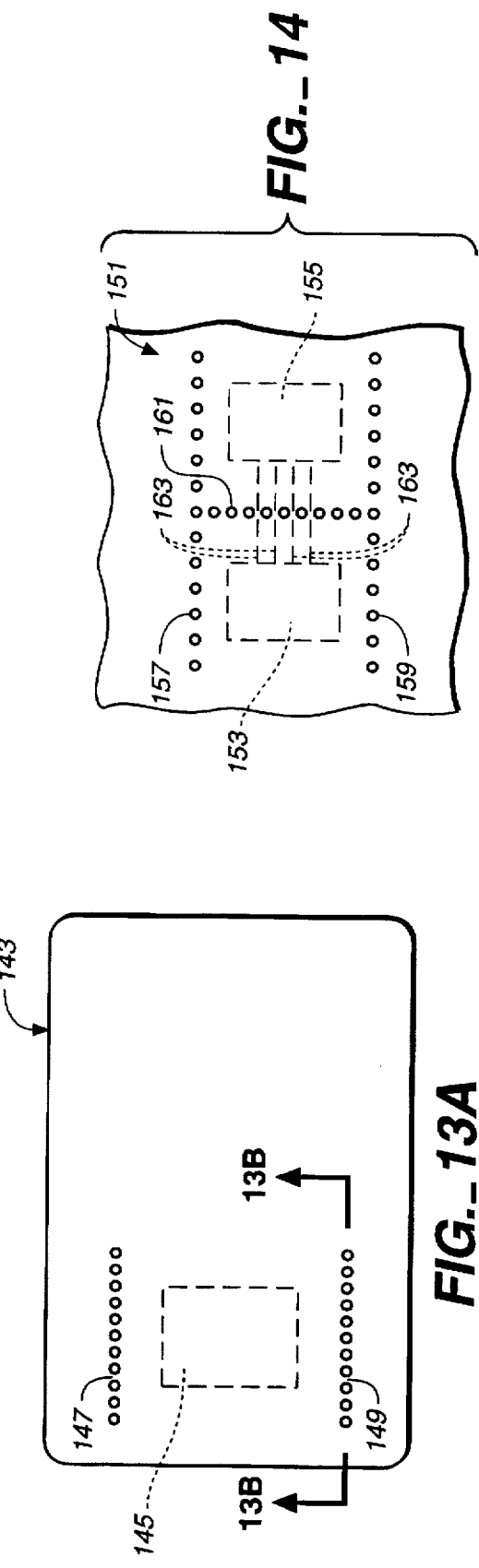

INTEGRATED CIRCUIT CHIPS MADE BENDABLE BY FORMING INDENTATIONS IN THEIR BACK SURFACES FLEXIBLE PACKAGES THEREOF AND METHODS OF MANUFACTURE

BACKGROUND OF THE INVENTION

This invention relates generally to physical aspects of integrated electronic circuit chips, and more specifically, to increasing the flexibility of integrated circuit chips and packages carrying them.

Integrated circuit chips made from silicon wafers are very stiff and brittle. When bent too far, such a chip breaks much like a sheet of window glass breaks when it is bent too far. Two trends have made it desirable for chips to be made more flexible than they have in the past. One trend is the use of integrated circuit chips in flexible packages. One such package is a "smart card" that encases a chip within a plastic laminate structure about the size of an ordinary credit card. Since the plastic encasing is bendable to some degree, it is certainly desirable that its embedded integrated circuit chip can bend the same amount without breaking. The second trend that is occurring is that integrated circuit chips are often being made larger, thus subjecting them to increased bending stresses and to a greater possibility of breakage when used in plastic or other packages that are subjected to mechanical and thermal stresses.

A primary technique being used to improve the flexibility of integrated circuit chips is to make them much thinner. This is accomplished by lapping the backside of a wafer after the integrated circuits are formed on the front side of the wafer. A typical lapping operation mechanically grinds away material from the backside of the wafer, such as by holding the wafer backside against a rotating wheel surface with an abrasive slurry between them. However, there are limits to how thin the wafer may be made by such a process, and thus limits on the degree of flexibility of its individual integrated circuit chips.

Therefore, it is the primary object of the present invention to provide integrated circuit chips that are more flexible than those formed by existing techniques.

It is a further object of the present invention to provide techniques for improving the flexibility of integrated circuit chips that are easy to implement, have a high yield and do not otherwise damage the chips.

SUMMARY OF THE INVENTION

These and additional objects of the present invention are accomplished, briefly and generally, by forming one or more indentations in the backsides of the integrated circuit chips after the circuit has been formed on the front side. The indentations can be in the form of grooves, trenches, notches, channels, slots, holes, or the like, either extending continuously across a chip or intermittently across the chip. The type and pattern of indentations are chosen so that the resulting chip has a level of flexibility to enable it to withstand bending in the direction or directions that its packaging allows. The indentations may be formed by one of several standard semiconductor processing etching techniques, by laser ablation or by mechanical scoring. The wafer may also be reduced in thickness overall by lapping before the indentations are formed. The indentations relieve mechanical stress in the integrated circuit chip and thus allow them to be bent further, without breaking, than they can without the indentations.

Additional objects, features and advantages of various aspects of the present invention are described below in conjunction with the accompanying drawings.

BRIEF DESCRIPTION OF THE DRAWINGS

FIGS. 1A–1F illustrate six different patterns of indentations in the backside of integrated circuit chips;

FIGS. 2A–2B generally illustrate in plan and cross-sectional views, respectively, a flexible package including the circuit chip of FIG. 1A;

FIG. 3 shows a backside of a wafer with one pattern of indentations formed thereof prior to the wafer being diced into its individual integrated circuit chips;

FIGS. 4, 5 and 6 are enlarged cross-sectional views of a portion of a wafer chip having indentations formed therein by three standard etching techniques used in semiconductor processing technology;

FIG. 7 illustrates indentations in the form of grooves made by mechanically sawing the backside of the wafer;

FIG. 8 illustrates the formation of the circuit chip backside indentations by laser ablation;

FIG. 9 is a cross-sectional view of an indentation with certain dimensions defined;

FIGS. 10A and 10B illustrate in plan and cross-sectional views, respectively, an existing smart card that includes an integrated circuit chip without the backside indentations of the present invention;

FIGS. 11A and 11B illustrate in plan and cross-sectional views, respectively, a smart card with the integrated circuit of FIG. 1A therein;

FIGS. 12A and 12B show in plan and cross-sectional views, respectively, a smart card including the integrated circuit chip of FIG. 1C and itself having indentations in one of its laminated layers in order to make the card itself more flexible;

FIGS. 13A and 13B show in plan and cross-sectional views, respectively, another improved smart card with an integrated circuit chip therein; and FIG. 14 shows yet another embodiment of a smart card, this one including multiple integrated circuit chips.

DESCRIPTION OF THE PREFERRED EMBODIMENTS

Referring initially to FIG. 1A, a rectangularly shaped integrated circuit chip 11 includes grooves 13 and 15 extending completely across its backside between opposite edges. These two grooves are parallel to one another and generally perpendicular to the opposing sides which they intersect. The sides of the grooves, their number and spacing between them are chosen to give the chip 11 a desired degree of flexibility. The chip 11 is shown to be square, while a circuit chip 17 of FIG. 1B is rectangular in shape with opposing edges 19 and 21 being longer than the other pair of edges. In either case, the sides may be in excess of five millimeters in length. The groove 23 extends completely across the chip 17 between its long sides 19 and 21 and is oriented perpendicularly to the long sides. As a result of the size of circuit chips increasing over time, the long sides 19 and 21 can easily be one centimeter in length and longer. Circuit chips in excess of two centimeters are becoming more common. This can result in the chip being subjected to significant stresses when bending forces are applied in its long direction. Therefore, the groove 23 is oriented in a direction generally parallel to an axis of such bending. Additional grooves parallel to the groove 23 can be positioned repetitively across the length of the chip, depending upon the degree of flexibility that is desired.

FIG. 2A shows the top of a package containing the chip of FIG. 1A, and FIG. 2B shows a cross-sectional view of FIG. 2A taken at section B—B thereof. This generic carrier structure includes electrically insulative layers 25 and 27 held on opposite sides of the chip 11. The layers 25 and 27 will generally be made of plastic and have some degree of flexibility. The layers 25 and 27 are affixed to each other around edges of the chip 11 in a standard molding operation. If the circuit chip is encased in a rigid structure, very large chips may still need to be provided with the additional flexibility that is provided by the present invention, due to possible mechanical stress when the thermal expansion characteristics of the package and the chip are mismatched. Moreover, there is a growing trend to directly attach unpackaged chips to printed circuit boards ("flip chip" or "chip on board") which may subject such chips to mechanical and thermal stresses, particularly when such printed circuit boards may be very thin (often called "flex circuits").

Because, in the example of FIGS. 2A and 2B, the grooves 13 and 15 extend in only one direction across the chip 11, the chip's flexibility is increased to allow greater bending in a direction shown in dotted outline in FIG. 2B. The package of FIG. 2B is shown to be bent in an arc 29 about an axis 31 that is elongated in a direction perpendicular to the paper. Because the grooves 13 and 15 extend in only one direction, they improve the flexibility of the chip in only the one direction shown.

However, as shown in FIG. 1C, orthogonal sets of grooves may be formed in the backside of the chip in order to improve its flexibility in two directions. A chip 33 includes one set 35 of parallel grooves and another set 37 of parallel grooves that are oriented perpendicularly to the grooves 35.

The grooves do not need to be maintained perpendicular to edges of the chips, as shown in the examples of FIGS. 1A through 1C, but can form some other angle, depending upon the direction in which the flexibility of the integrated circuit chip needs to be increased for a particular packaging application. In FIG. 1D, a circuit chip 39 includes a plurality of parallel grooves extending across its back side with equal spacing between them and intersecting the chip edges at an acute angle.

In FIG. 1E, an integrated circuit chip 41 includes, in addition to a groove 43 extending across the chip in one direction, four grooves 45, 47, 49 and 51 that extend across respective corners of the chip 41. Each of these corner grooves relieves mechanical stress in the chip at its corners where it is particularly susceptible to breakage from bending. The corner grooves reduce the risk of such corner breakage. Each of the corner grooves 45, 47, 49 and 51 is preferably oriented to form a base of a right triangle with its corner as the apex of the triangle. This corner relief can be used by itself or in combination with other patterns of grooves, such as with the single groove 43 shown in the example of FIG. 1E.

Each of the wafer chip backside indentation patterns illustrated in FIGS. 1A through 1E are formed of straight grooves extending from one edge of the chip to the other. Although it is usually preferable to make the grooves straight, it need not necessarily be so, if it is desired to have a curved or some other shape in order to make the chip bendable in some particular direction or manner. Further, integrated circuit chips themselves need not be in the shape of a square or some other rectangle but could be round, oval, etc., if there is some need that would justify added difficulty in doing so. Further, the indentations do not need to be continuous grooves but can instead be discontinuous along a line. An example is a pattern of holes extending along the paths of the grooves shown in FIGS. 1A through 1E, the holes being separated a small distance from each other.

Indeed, as shown in FIG. 1F, an integrated circuit chip 53 contains indentations in the form of a two-dimensional pattern of regularly spaced circular holes such as the holes 55, 57 and 59. Such a pattern provides the chip 53 with additional flexibility to permit bending in nearly any direction. Such a pattern can also be formed of apertures with shapes other than circular holes, such as elongated slots, if it is desired to make the chip 53 more flexible in one direction than in another.

Rather than forming the indentations separately in each chip, they are formed on the backside of a wafer containing many replicas of the integrated circuit before those replicas are physically separated into the individual circuit chips. FIG. 3 shows a backside of a wafer 61 with an outline of individual circuits 63, 65, 67, etc., formed on the front side of the wafer being shown in dotted outline. In this example, a number of parallel equally spaced grooves, such as grooves 69 and 71, are formed across the backside of the wafer. Prior to forming the grooves, the backside of the wafer may be lapped to uniformly reduce its thickness, but if this step is utilized, the wafer need not be reduced in thickness so much as in the past. Once the grooves are formed, the wafer 61 is then separated into its individual die (chips) that each contain the integrated circuit replicas.

There are many ways in which the indentations can be formed in the wafer backside. Referring to FIG. 4, a cross sectional view of a small portion of a wafer 73 is illustrated. On a front side of the wafer, in a few microns of the wafer or of an epitaxial layer formed thereon, is an active integrated circuit 71. To form indentations on the backside of the wafer 73, a masking layer 75 is formed on the wafer backside with openings 77 and 79 over regions of the wafer where grooves or other types of indentations are to be formed. Such a mask can be a photoresist material, oxide layer, nitride layer, and the like, selected from masking materials commonly used in semiconductor processing. The type of mask depends upon the type of etching process being used. A layer of such material is first applied to the wafer backside and then patterned with a technique also selected from those commonly used in semiconductor processes.

In the example of FIG. 4, indentations 81 and 83 have sloped sidewalls. This is accomplished by a differential etch of the silicon through the openings 77 and 79. One example of such an etchant that is commonly used is a mixture of potassium hydroxide (KOH) and isopropyl alcohol. The etch rate of this etchant is considerably faster along certain planes of the crystal structure than others, thus resulting in the shape shown in FIG. 4. This etching process stops itself when its sloping sidewalls meet each other at the bottom of the indentation. Thus, the depth of the indentations 81 and 82 are dependent upon the width of the openings 77 and 79. Other preferential etchants may alternatively be used.

In FIG. 5, the same apertured mask is formed over a backside of a wafer 85 having an integrated circuit 87 formed on a front surface. Indentations 89 and 91 are formed by an anisotropic etch such as results from plasma etching processes commonly used in semiconductor processing. The walls of the indentations 89 and 91 are thus perpendicular to the backside surface of the wafer 85, and have a depth that depends on the amount of time that the wafer is subjected to the etching process. Isotropic plasma etching may alternatively be used to form more rounded corners at the bottom of the indentations.

FIG. 6 illustrates use of a common semiconductor wet etch process to form the indentations. The same mask 75 is applied to a backside of a wafer 93 that has an integrated circuit 95 on a front surface thereof. Grooves or other forms of indentations 97 and 99 are thus formed through the openings 77 and 79 of the mask 75. Indentations formed by a wet etch process will have a width greater than that of their respective mask openings, and their depth is controlled by controlling parameters of the wet etch process, in particular the time to which the wafer is subjected to the etching solution. The use of a wet etching process requires that the front side of the wafer be properly protected from attack by the etching solution.

A different method of forming grooves is illustrated in FIG. 7. A wafer 101 has grooves 103 and 105 mechanically cut by use of a rotating abrasive wheel 107. The wafer is mechanically stepped by the distance between grooves and the saw then cuts a single groove across the wafer. The depth of the groove must not be allowed to extend too close to the front surface of the wafer since it could damage the active integrated circuit. Since the dimensions of the grooves and their spacing are large relative to the dimensions used to form integrated circuits, various mechanical techniques can be used to form the grooves.

FIG. 8 illustrates a laser technique for forming grooves or other indentations. A beam 115 of radiation is scanned across the backside of the wafer to ablate silicon material from the wafer according to a controlled pattern. This is shown in FIG. 8 to form grooves or other forms of indentations 117 and 119. The radiation wavelength of the beam 115 is selected to be one within the region of the spectrum to which the silicon material of the substrate 111 is highly absorptive. The depth of the grooves depends upon the wavelength and intensity of the radiation directed against the wafer, and the exposure time.

Depending upon the method used to form the indentations, and the particulars of the indentations, silicon debris can be generated and mechanical stresses created in the wafer. Such debris is cleaned away and the mechanical stresses relieved by use of a known technique, such as by dipping the wafer in a chemical bath of nitric acid. The integrated circuit on the front side of the wafer is, of course, protected during such dipping by previously being coated with a protective layer of material that is unaffected by nitric acid. Indeed, the wafer front side will usually be coated with a layer of material that protects the integrated circuit during each of the backside processing steps being described herein. Such a layer can then be removed prior to packaging.

A typical six inch wafer, for example, has a thickness of about 550 microns. The circuit formed on the front side of the wafer typically resides within the top layer extending 3 to 7 microns in depth from the front surface. After forming the circuits but before dicing the wafer into its individual circuit chips, the wafer is thinned to a thickness of between 200 and 300 microns by lapping its backside. The desired pattern of grooves is then formed in the wafer backside. However, it is also possible to form the desired pattern of grooves first and only then to lap the backside to the desired thickness. Prior attempts to increase the flexibility of the chips has been accomplished by uniformly reducing the thickness of the wafer to about 140 microns by lapping.

With reference to FIG. 9, some preferred dimensional ranges of an example indentation are given. The thickness of a wafer 121 before a groove 123 is formed in a backside thereof is a combination of "a" plus "b". This total is 300 microns in the example six inch diameter wafer. The integrated circuit is formed in a layer "c" that is the 3–7 micron thick layer, either formed into the front wafer surface or an epitaxial layer grown on that surface.

A depth "b" of the indentation 123 is made to be at least 20 percent of the thickness ("a" plus "b") of the wafer. As a limit to that indentation depth, a thickness amount "a" of at least 25 microns is retained. The dimension "a" is a distance from an outside of the formed integrated circuit to an inward extent of the groove or other indentation 123. Currently employed lapping techniques cannot reduce the thickness of the wafer overall to something as small as 25 microns. The depth "b" of the groove may typically be 25 to 300 microns, so long as "a" is at least 25 microns. A width "d" of the groove or other indentation can vary widely, a useful range being 25 microns to 300 microns. Spacing between adjacent parallel grooves is typically 0.5 to 5.0 millimeters. The width "d" is selected to be at the lower end of the preferred 25–300 micron range when the grooves are closely spaced, and toward a higher end of that range when more widely spaced.

A groove or other type of indentation having a rounded cross-sectional shape (FIGS. 6 and 9) is generally preferred over one having sharp edge(s) (FIGS. 4, 5, 7 and 8), since stresses resulting from the circuit chip being bent are less concentrated. Therefore, it is often preferred to reduce the sharpness of the edges resulting in the embodiments of FIGS. 4, 5, 7 and 8, by subsequently performing an isotropic etching step.

FIG. 10A illustrates an existing smart card 125 having an integrated circuit 127 carried in it. As shown in the cross-sectional view of FIG. 10B, taken at section B—B of FIG. 10A, the example smart card includes outer plastic layers 129 and 131 that are laminated to a core layer 133. An opening 135 is made in the core 133 to provide space for the integrated circuit chip 127, which, in this example is shown adhered to the outer layer 131. Such cards are becoming widely used for security identification, as prepaid cash cards, to hold medical information and the like. Applications of smart cards are expanding rapidly. In nearly all cases, these cards are carried by individuals and can be subjected to rough handling, including bending. The laminate structure for such cards, although somewhat stiff, does permit some degree of bending by the individuals who use the card. Because of the brittle nature of the circuit chip 127, that chip can be broken if the card is bent sufficiently. Such breakage becomes more likely as the size of the chip 127 becomes larger, which is a trend.

Therefore, referring to FIGS. 11A and 11B, the chances of such chip breakage are considerably reduced when the chip enclosed in the smart card includes the backside indentations that have been previously described. The chip 11 of FIGS. 11A and 11B is installed with its grooves 13 and 15 extending in a direction that is parallel to the narrow edges of the card 125'. This orientation allows the chip 11 to be bent as the card is bent when its opposing short ends are moved toward each other in the long direction.

In the example smart card of FIGS. 12A and 12B, the example chip 33 (FIG. 1C) is utilized. Because of its perpendicular sets of grooves, flexibility is provided in two orthogonal directions. In addition to accommodating bending of the card 125" in two directions, the card itself is modified in this embodiment by the formation of similar grooves in its inner core layer 133". The cross-sectional view of FIG. 12B, taken across section B—B of FIG. 12A, shows grooves 137, 139 and 141. The pattern of such grooves in the card is preferably made to be the same as the pattern of grooves on the integrated circuit imbedded therein, thereby to allow the circuit chip to bend in the same directions that the card can bend. Thus, if grooves in the card are not sufficient to prevent bending forces from reaching the circuit chip, the chip itself is then able to bend a certain amount in the same direction without breaking. In the example of FIGS. 11A and 11B, such grooves can be included in the core 133' and oriented to be parallel with the grooves of the circuit chip 13. Numerous other specific arrangements are also possible in order to reduce the resistance to bending in the same direction in both the card and its circuit chip.

Alternatively, the grooves in the circuit chip and card can be made somewhat different in order to cooperate with each other to maximize the flexibility of the composite structure. For example, the grooves formed in the core 133" of FIG. 12B can be formed into its top surface rather than the bottom surface shown. This allows the plastic core to absorb bending stresses in one direction while the chip absorbs bending stresses in the opposite direction.

Another smart card embodiment is shown in FIGS. 13A and 13B. A card 143 includes a rectangularly shaped circuit chip 145. Positioned adjacent the shorter sides of the circuit chip 145 are lines of perforations 147 and 149 formed in the card. The perforations are in the form of a row of spaced apart holes extending in a straight line, a cross-sectional view of the perforations 149 being shown in FIG. 13B. Although the perforations are shown in this embodiment to extend completely through the card, the desired weakening of the card to bending can be accomplished by perforating less than the entire thickness of the card.

Future generations of smart cards may require that at least two circuit chips be used. A way of accommodating two chips in a smart card is shown in FIG. 14. A card 151 includes two integrated circuit chips 153 and 155. Lines of perforations 157 and 159 extend along opposite sides of circuit chips 153 and 155 and are parallel with each other and those edges of the chips. In between the circuit chips 153 and 155 is another line of perforations 161. The individual perforations 161 are preferably spaced apart a distance that is sufficient to allow electrical conductive lines 163 to extend between the chips 153 and 155 in these spaces. The result of both of the FIG. 13 and FIG. 14 embodiments is that the card is made bendable adjacent the integrated circuit chip so that bending forces applied to outside edges of the card are either not significantly transmitted to the integrated circuit chips embedded therein, or are greatly reduced.

The indentations formed on the circuit chips of the FIGS. 13 and 14 embodiments remain to improve flexibility of the circuit chip in the directions in which they are likely to be bent but the pattern of perforations in the card itself adjacent the chip significantly reduces the bending of the chip in certain directions.

Although the various aspects of the present invention have been described with respect to their preferred embodiments, it will be understood that the invention is entitled to protection within the full scope of the appended claims.

It is claimed:

1. A bendable electronic circuit chip, comprising:
   a rectangularly shaped substrate having first and second opposing surfaces,
   an integrated circuit formed on said first substrate surface, and
   at least one indentation into said second substrate surface in a manner to allow flexing of the circuit chip at a location of said indentation.

2. The circuit chip of claim 1 wherein said substrate is in the shape of a square.

3. The circuit chip of claim 1, wherein said at least one indentation includes at least one groove.

4. The circuit chip of claim 3, wherein said substrate is shaped as a rectangle with one pair of opposing sides being longer than another pair of opposing sides, and wherein said at least one groove extends across said substrate in a direction perpendicular to said one pair of opposing sides at a position between said another pair of opposing sides.

5. The circuit chip of claim 4, wherein said one pair of opposing sides have a length in excess of five millimeters.

6. The circuit chip of claim 3 wherein said at least one groove extends between adjacent sides that join at a corner in a manner that a right triangle is formed with said at least one groove forming a base and the corner an apex of said triangle.

7. The circuit chip of claim 3 wherein said substrate has four corners and said at least one groove includes a groove extending across each of the four corners between adjacent sides of the substrate.

8. The circuit chip of claim 3 wherein said at least one groove includes a plurality of elongated grooves positioned with their lengths extending in one direction across said second substrate surface at regularly spaced intervals in a second direction across said second substrate surface, said first and second directions being perpendicular to each other.

9. The circuit chip of claim 8 wherein said plurality of elongated grooves are oriented with their lengths oriented perpendicularly with sides of the substrate.

10. The circuit chip of claim 3 wherein said at least one groove includes at least two elongated grooves oriented perpendicularly with each other.

11. The circuit chip of claim 1 wherein said at least one indentation includes a plurality of holes.

12. The circuit chip of claim 11 wherein said plurality of holes are arranged in at least one straight line.

13. The circuit chip of claim 11 wherein said plurality of holes are arranged in a two dimensional pattern across said second substrate surface.

14. The circuit chip of any one of claims 1–13, wherein said at least one indentation has a depth into the substrate from said second substrate surface that is at least 20 percent of a thickness of the substrate and integrated circuit formed thereon.

15. The circuit chip of claim 14, wherein said substrate and said integrated circuit formed thereon have a thickness that is greater than 25 microns.

16. The circuit chip of any one of claims 3–10 wherein said at least one groove has a width at said second substrate surface that lies within a range of from 25 to 300 microns.

17. The circuit chip of either of claims 8 or 9, wherein said regularly spaced intervals are within a range of from one-half to 5 millimeters.

18. The circuit chip of any one of claims 1, 3 or 11, wherein said at least one indentation has a depth within a range of from 25 to 300 microns.

19. The circuit chip of any one of claims 1, 3 or 11, that is contained within a molded plastic package.

20. The circuit chip of any one of claims 1, 3 or 11, that is attached directly to a printed circuit board.

21. An electronic package, comprising:
   an electrically insulating carrier that is bendable in at least one direction about an axis, and a brittle semiconductor chip attached to said carrier, said chip including:
a substrate having first and second opposing surfaces,
an integrated circuit formed on said first substrate surface, and
at least one indentation in said second substrate surface that allows a degree of bending of the package in said at least one direction without breaking the chip.

22. The electronic package of claim 21 wherein said at least one indentation includes at least one elongated groove with its length extending in a direction generally parallel with said axis.

23. The electronic package of claim 21 wherein said at least one indentation includes at least one row of a plurality of holes with a length of the row extending in a direction generally parallel with said axis.

24. The electronic package of any one of claims 21–23 wherein said carrier is thinned along at least one line having a length extending in a direction generally parallel with said axis.

25. The electronic package of claim 21 wherein said semiconductor chip is rectangular in shape with one pair of opposing edges being longer than another pair of opposing edges, and wherein said carrier is weakened along lines on opposite sides of said another pair of opposing edges and oriented parallel therewith.

26. The electronic package of claim 21 wherein said at least one indentation is elongated and extends across said circuit chip.

27. The electronic package of claim 26 wherein said carrier is thinned along a line that is parallel with said at least one indentation.

28. The electronic package of any one of claims 21–23 or 25–27 wherein said carrier includes at least first and second layers positioned on opposite sides of said circuit chip and attached together.

29. The electronic package of any one of claims 21–23 or 25–27 wherein said carrier has an area at least 5 times the area of said circuit chip.

30. The electronic package of any one of claims 21–23 or 25–27 wherein said carrier includes a flexible printed circuit substrate to which said semiconductor chip is directly attached.

31. The electronic package of claim 29, wherein said electronic package functions as a smart card.

32. The electronic package of claim 21, wherein said substrate is shaped as a rectangle with one pair of opposing sides being longer than another pair of opposing sides, and wherein said at least one indentation is elongated with its length extending across said substrate in a direction perpendicular to said one pair of opposing sides at a position between said another pair of opposing sides.

33. The electronic package of claim 32, wherein said one pair of opposing sides have a length in excess of five millimeters.

34. The electronic package of claim 21 wherein said at least one indentation is elongated with its length extending between adjacent sides that join at a corner in a manner that a right triangle if formed with said at least one groove forming a base and the corner an apex of said triangle.

35. The electronic package of claim 21 wherein said substrate has four corners and said at least one indentation includes an elongated indentation extending across each of the four corners between adjacent sides of the substrate.

36. The electronic package of claim 21 wherein said at least one indentation includes a plurality of elongated indentations positioned with their lengths extending in one direction across said second substrate surface at regularly spaced intervals in a second direction across said second substrate surface, said first and second directions being perpendicular to each other.

37. An electronic package, comprising:
an electrically insulating carrier,
at least two semiconductor chips attached to said carrier,
a plurality of perforations extending at least partially through the carrier in a position in between said at least two semiconductor chips, and
conductive lines extending along said carrier in between said perforations to interconnect said at least two semiconductor chips.

38. The electronic package of claim 37, wherein said at least two semiconductor chips are rectangularly shaped with adjacent edges being parallel with each other and said plurality of perforations extending in a line positioned between said parallel semiconductor chip edges and parallel therewith.

39. A method of making a bendable integrated circuit structure, comprising:
forming a plurality of replicas of an integrated circuit across one side of a semiconductor wafer,
thereafter forming a plurality of indentations across an opposite side of said wafer such that at least one indentation extends across individual ones of the integrated circuit replicas, and
thereafter separating the wafer into the individual ones of the integrated circuit replicas, whereby a plurality of bendable integrated circuit chips result.

40. The method according to claim 39, wherein forming the plurality of indentations includes forming a mask over said opposite side of said wafer to define locations of said plurality of indentations and then forming the indentations by etching through the mask into the opposite side of said wafer.

41. The method according to claim 40, wherein the etching is accomplished by an anisotropic etch.

42. The method according to claim 40, wherein the etching is accomplished by an isotropic etch.

43. The method according to any one of claims 39–42, wherein forming the plurality of indentations includes forming a plurality of elongated grooves.

44. The method according to any one of claims 39–42, wherein forming the plurality of indentations includes forming a plurality of holes not extending to said integrated circuits.

45. The method according to claim 44, wherein forming the plurality of holes includes forming a plurality of elongated lines of holes that are spaced apart along the lines.

46. The method according to claim 44, wherein forming the plurality of holes includes forming a two dimensional pattern of holes across the individual chips.

47. The method according to claim 39, wherein forming the plurality of indentations includes mechanically cutting grooves that do not extend to said integrated circuits.

48. The method according to claim 39, wherein forming the plurality of indentations includes scanning a laser beam across the opposite side of said wafer in a manner to ablate the wafer material according to a desired pattern.

49. The method according to claim 39 which additionally comprises, after forming the plurality of integrated circuit replicas and before forming the indentations, lapping the opposite side of said wafer in order to reduce the thickness of the wafer uniformly thereover.

50. The method according to any one of claims 39–42, 48 or 49, wherein the plurality of indentations are formed to a depth in the semiconductor wafer that is at least 20 percent of a thickness of the substrate and the integrated circuit formed thereon but less than that which would result in less than 25 microns of a thickness of the substrate and the integrated circuit thereon remaining under the individual indentations.

51. The method according to any one of claims 39, 40, 48 or 49, wherein the plurality of indentations are formed as elongated grooves that individually have a width at said opposite wafer side that lies within a range of from 25 to 300 microns.

52. The method according to any one of claims 39, 40, 48 or 49, wherein the plurality of indentations are formed as elongated parallel grooves that are regularly spaced across the wafer at an interval that lies within a range of from one-half to 5 millimeters.

53. The method according to any one of claims 39, 40, 48 or 49, wherein the plurality of indentations are formed to a depth within a range of from 25 to 300 microns.

54. The method according to any one of claims 39, 40, 48 or 49, wherein the plurality of indentations are formed as two sets of regularly spaced elongated parallel grooves extending across the wafer in directions perpendicular to each other.

55. The method according to claim 39 which additionally comprises attaching individual ones of the integrated circuit chips to corresponding individual flexible carriers.

56. The method according to claim 55 wherein attaching the integrated circuit chips to the carriers includes attaching said chips between at least two layers of dielectric material.

57. The method according to claim 55 wherein attaching the integrated circuit chips to the carriers includes directly attaching said chips to flexible printed circuit substrates.

58. The method according to any one of claims 55–57, wherein the individual integrated circuit chips are attached to individual flexible carriers that have an area that is at least 5 times the area of said integrated circuit chip.

59. The method according to any one of claims 39–42, 47 or 48, which additionally comprises, after forming the plurality of indentations, of applying a solution of nitric acid to the opposite side of the wafer, whereby any debris is removed from the indentations and stress created in the wafer from forming the indentations is relieved.

* * * * *